United States Patent
Esumi et al.

(10) Patent No.: US 9,548,761 B2
(45) Date of Patent: Jan. 17, 2017

(54) CODING AND DECODING OF ERROR CORRECTING CODES

(71) Applicant: SIGLEAD Inc., Kanagawa (JP)

(72) Inventors: Atsushi Esumi, Kanagawa (JP); Kai Li, Kanagawa (JP)

(73) Assignee: SIGLEAD INC., Kanagawa (JP)

( * ) Notice: Subject to any disclaimer, the term of this patent is extended or adjusted under 35 U.S.C. 154(b) by 545 days.

(21) Appl. No.: 13/940,328

(22) Filed: Jul. 12, 2013

(65) Prior Publication Data

US 2014/0019822 A1 Jan. 16, 2014

(30) Foreign Application Priority Data

Jul. 13, 2012 (JP) ................. 2012-158060

(51) Int. Cl.
*H03M 13/00* (2006.01)
*H03M 13/29* (2006.01)
*H03M 13/15* (2006.01)

(52) U.S. Cl.
CPC ....... *H03M 13/2906* (2013.01); *H03M 13/152* (2013.01)

(58) Field of Classification Search
CPC H03M 13/2957; H03M 13/45; H03M 1/0045; H03M 13/1111; H03M 13/1102
USPC ......................................... 714/780
See application file for complete search history.

(56) References Cited

U.S. PATENT DOCUMENTS

| | | | | |
|---|---|---|---|---|
| 2002/0191456 | A1* | 12/2002 | Ando | G11B 20/10055 365/200 |
| 2008/0172593 | A1* | 7/2008 | Rainish | H04N 19/89 714/776 |
| 2009/0132894 | A1* | 5/2009 | Xu | H03M 13/27 714/780 |
| 2011/0258514 | A1 | 10/2011 | Lasser | |
| 2012/0317334 | A1* | 12/2012 | Suzuki | G06F 3/0608 711/103 |

FOREIGN PATENT DOCUMENTS

JP 2008-108297 A 5/2008
JP 2011-003975 A 1/2011

* cited by examiner

*Primary Examiner* — Albert Decady
*Assistant Examiner* — Enam Ahmed
(74) *Attorney, Agent, or Firm* — Buchanan Ingersoll & Rooney PC

(57) ABSTRACT

A coding method intended to increase the error correction performance without greatly increasing the size of an error correction circuit, the method, as illustrated in FIG. 1A, includes the steps of dividing data constituting one page and yet to be coded into data blocks including a first data block located on one end of the one page to a fourth data block located on the other end of the one page; generating a first error correcting code by coding the first data block; generating a second error correcting code by coding a second data block and a part of the first data block in combination; generating a third error correcting code by coding a third data block and a part of the second data block in combination; and generating a fourth error correcting code by coding a fourth data block and a part of the third data block in combination.

11 Claims, 8 Drawing Sheets

ORDINARY BCH CODE (BCH (t-bit/N-byte))

FIRST EXAMPLE OF BCH CODING OF THE INVENTION

SECOND EXAMPLE OF BCH CODING OF THE INVENTION

ORDINARY BCH CODE (NUMBER OF CODES: 3)

CASE WHERE NUMBER OF BCH CODES IS INCREASED FROM 3 TO 4

ORDINARY BCH CODES (BCH (t-bit/N-byte))

THIRD EXAMPLE OF BCH CODING OF THE INVENTION

FOURTH EXAMPLE OF BCH CODING OF THE INVENTION

ORDINARY BCH CODES (BCH (t-bit/N-byte))

CODING WITH RIGHT-LEFT SYMMETRIC RING STRUCTURE

CORRECTABLE BY ORDINARY CODING (BCH (4-bit/N-byte))

USING SYMMETRIC RING STRUCTURE, UNCORRECTABLE

ERRORS DISTRIBUTED IN THE SIMILAR MANNER AS IN FIG.7A

CORRECTABLE

CODING AND DECODING OF ERROR CORRECTING CODES

BACKGROUND OF THE INVENTION

1. Field of the Invention

The present invention relates to coding and decoding methods for error correcting codes used for correcting data errors, and further relates to coding and decoding devices corresponding to such methods.

2. Description of the Related Art

In the fields of information processing and telecommunication, it is required to detect and correct errors occurring at the time of transmitting, receiving, and storing information symbol sequences, i.e., data generated by binarizing information to be transmitted, such as texts, still images, moving images, and voice. Errors occur in data due to noises and imperfect media at the time of executing network communications, writing and reading of data to and from storage media such as digital versatile discs (DVD) and flash memories. In order to deal with the occurrence of such errors, using redundancy codes which are added to original data beforehand, it is determined whether any error has occurred, and the original data is reproduced even if any error is detected. In other words, redundancy codes are added to the original data to convert the data into a codeword sequence. Such a codeword sequence with redundancy is referred to as an "error correcting code".

Non-volatile semiconductor memories called flash memories are becoming smaller in size and larger in terms of their capacity. Such flash memories have a storage area including a plurality of uniformly sized blocks, and each block includes a plurality of uniformly sized pages. Data are erased from a flash memory on a block-by-block basis, and read out of and written into a flash memory on a page-by-page basis. Flash memories have gained larger storage capacity through miniaturization and multi-level cell technology. A side effect of larger storage capacity is an increasing number of error bits. It is a common practice to correct errors with the use of an error correcting code (ECC). Examples of error correcting codes include BCH, Reed-Solomon, and low-density parity-check (LDPC) codes.

In a flash memory, data in one page are divided and stored in four sections, for example. In other words, four sections placed side by side constitute a single page. Each such section stores one error correcting code. The error correcting code includes a parity check symbol (redundant bits) corresponding to a specific error correction coding scheme in addition to information symbols (original data). If the same coding method is used, error correction performance improves when the number of redundant bits is larger. The number of redundant bits is on the rise as the memory cells utilize multi-level technologies and miniaturization advances, or as higher reliability is required. On the other hand, as the number of redundant bits increases, and the number of correctable error bits, which is determined in accordance with the number of redundant bits, increases, circuitry for error correction becomes larger. This increase in circuit size means a smaller area for data storage and a smaller storage capacity. The increased numbers of redundant bits and correctable error bits also lead to increased time required for reading and reproducing user data. Accordingly, it is required to improve the error correcting performance without increasing the number of redundant bits.

It is similarly important in the field of telecommunication to improve error correcting performance. With the increased communication line speed, a higher error correcting performance is required with limited physical resources. In this specification and claims, the term "page", which is used mainly in the field of storage medium, is primarily used. This term "page", generally refers to data of one unit and also include concepts used in the field of communication such as "transmit data block" and "transport block". For example, the concept "transport block" is used in the long-term evolution (LTE) standards or the evolved universal terrestrial radio access (E-UTRA) standards by the standardizing body 3GPP, and these are equivalent to the term "page".

JP A 2008-108297 describes a non-volatile semiconductor storage device improved in error correction efficiency by mixing a high-error rate portion with a low-error rate portion in a single ECC frame and thus evening out location-dependent fluctuations in error rate among ECC frames.

JP A 2011-003975 describes a technique for generating a transport block codeword by dividing a transport block into a plurality of code blocks so that each code block includes a part of another code block, generating code block codewords by executing error correction coding processing to each of the plurality of code blocks, and combining the code block codewords together. In all examples illustrated in the drawings, an overlap portion is provided between a leftmost-end code block and a rightmost-end code block.

SUMMARY OF THE INVENTION

In view of the above-described problems, the present invention provides a novel error correcting code generation method.

According to a first aspect of the present invention, a coding method is provided, which comprises the steps of: dividing data constituting one page and yet to be coded into data blocks including a first data block located on one end of the one page to an M-th data block located on the other end of the one page, wherein M is an integer of 3 or greater; generating a first error correcting code by coding the first data block; generating a second error correcting code by coding a second data block and a part of the first error correcting code or the first data block in combination; executing processing executed on the second data block on a third data block and up to an (M−1)-th data block by shifting the error correcting code or the data block to be combined by one code or one block; and generating an M-th error correcting code by coding an M-th data block and a part of the (M−1)-th error correcting code or the (M−1)-th data block combined together, wherein the step of generating the first error correcting code to the step of generating the M-th error correcting code are serially or simultaneously executed.

According to a second aspect of the present invention, an error correction coding method is provided, which comprises the steps of: dividing data constituting one page and yet to be coded into data blocks including a first data block located on one end of the one page to an M-th data block located on the other end of the one page, wherein M is an integer of 3 or greater; generating a first error correcting code by coding the first data block and a part of a second data block in combination; generating a second error correcting code by combining and coding a second data block, a part of the first error correcting code or the first data block, and a part of a third data block in combination; executing processing executed on the second data block to the third block and beyond up to an (M−1)-th data block by shifting the error correcting code or the data block to be combined by one code or one block; and generating an M-th error correcting code by coding the M-th data block, and a part of the (M−1)-th error correcting code or the (M−1)-th data block in combination, wherein the step for generating the first error correcting code to the step of generating the M-th error correcting code are serially or simultaneously executed.

To a data block which is coded with a relatively small portion of another data block or another error correction code in combination compared to the size of data to be coded or which is coded with a portion of data not to be coded in an overlapping manner is relatively large, an ECC with higher correcting strength is applied than that applied to a data block other than the data block of which the portion to be coded in combination is relatively small for the size of data to be coded or of which the portion not to be coded in an overlapping manner is relatively large. The total performance can be improved.

According to a third aspect of the present invention, an error correction decoding method is provided, which comprises the steps of: determining whether an error is successfully corrected by decoding a k-th error correcting code coded by the error correction coding method according to any of the above-mentioned coding methods; if the correction is not successful, determining whether a (k+1)-th error correcting code including a portion that has been coded in combination with the k-th error correcting code or a (k−1)-th error correcting code or both can successfully correct an error, and substituting a corresponding portion of the k-th error correcting code by utilizing a successfully corrected error correcting code; and decoding the substituted k-th error correcting code.

Considering a case where M=2 in the above-described coding methods, according to a fourth aspect of the present invention, a coding method is provided which includes the steps of: dividing data constituting one page and yet to be coded into two data blocks including a first data block and a second data block; generating a first error correcting code by coding the first data block; and generating a second error correcting code by combining and coding a part of the first error correcting code or the first data block and the second data block in combination.

As a modification of the fourth aspect, a coding method is provided, in which a first error correcting code is generated by coding the first data block and a part of the second data block in combination, and a second error correcting code is generated by combining and coding the second data block and a part of the first error correcting code or the first data block.

Another error correction decoding method is provided which includes the steps of: determining whether correction of an error has been successfully executed by decoding a first error correcting code coded by the error correction coding method according to any of the above-mentioned method; if the correction is not successful, determining whether a second error correcting code can successfully correct an error, and if correction of the second error correcting code is successful, substituting a part of the first error correcting code by utilizing a successfully corrected second error correcting code; and if correction of the first error correcting code is successful, decoding the second error correcting code by substituting the portion of the second error correcting code coded in combination with the first error correcting code.

In addition, according to a fifth aspect of the invention, a coding device is provided, coding device comprising: a page data dividing unit configured to divide data constituting one page and yet to be coded into data blocks including a first data block located on one end of the one page to an M-th data block located on the other end of the one page; a coding preparation unit configured to generate data to be coded by adding data in a part of an adjacent data block or an adjacent error correcting code to an original data block according to a predetermined rule; an error correction coding unit configured to generate error correcting codes corresponding to respective data blocks by executing coding on the generated data; and a combining unit configured to generate coded page data by combining the generated error correcting codes.

According to a sixth aspect of the present invention, a decoding device is provided, comprising: a code separating unit configured to separate coding page data into respective error correcting codes constituting the coding page data according to a rule used when coding; a decoding unit configured to decode the separated error correcting codes to obtain decoded data; an error detection unit configured to verify whether any error is included in the decoded data; a substituting code generation unit configured, if any error is included in decoded data corresponding to a subject error correcting code, to determine whether one or two error correcting codes that have a portion coded in combination with the subject error correcting code are decoded and corrected without an error by using the error detection unit and substitute a portion of the subject error correcting code by utilizing the error correcting code that has been corrected without an error, so as to generate a substituted error correcting code and return the same to the buffer; and a page data restructuring unit configured to output page data corrected without an error.

DESCRIPTION OF THE EMBODIMENTS

Embodiments of the present invention will be described below. In the following, we use error correction for a flash memory using BCH coding as an example. However, the present invention can be similarly implemented by utilizing other systematic codes, such as Reed-Solomon (RS) and LDPC coding. Systematic codes refer to codes with which original data (which is also referred to as "information symbols," but herein simply referred to as "data") are represented in a codeword without being processed. One codeword is constituted by data and check symbols. Parity check symbols (hereinafter referred to as "parity bits" or, for short, "parity") included in a codeword are placed adjacent to the data, included in the data, or stored at another location. The present invention can be implemented in any type of information processing required for telecommunication, digital versatile discs (DVDs), and hard disks, in addition to flash memories, as long as such implementation relates to data error correction.

Figure 1A:
FIGS. 1A to 1C are conceptual diagrams illustrating an example of a coding method according to the present invention in contrast with the conventional method.

FIG. 1 illustrates an example of a coding method according to the present invention. In general, when systematic codes (BCH, RS, and LDPC coding) are involved, data and a parity to be added to the data are prepared. Referring to FIG. 1A, assume that four data blocks exist. In ordinary BCH coding, predetermined processing is executed at first to data block 1 of the four data blocks to generate parity 1. Data block 1 and parity 1 are associated with each other. When decoding, the read data block 1 and parity 1 are utilized to obtain an error-corrected data block 1. Of course, if too many errors occur in data block 1 and parity 1, the error correction fails.

In FIG. 1A, "BCH (t-bit/N-byte)" represents that the maximum number of correctable error bits is t and that length of the BCH code is N. The units for N are byte in this example, although the units for N are by no means restricted to byte. To describe an exemplary case of correcting errors in connection a flash memory, each of data blocks obtained by dividing original data sequence to be coded is coded for BCH codewords. Error correction is applied to each of the data blocks 1 to 4 separately. The decoding results of a BCH code adjacent to a particular BCH code will not exert any influence on the operation or results of decoding the particular code.

In the embodiment illustrated in FIG. 1A, such BCH codes and their parity bits are stored within one page separately from one another. Because a BCH code is a systematic code, the four sets of parity bits or parities 1 to 4 may be stored together at a location subsequent to data blocks 1 to 4 is illustrated in FIG. 1A. In FIG. 1A, the parity bits are not stored in portions to be read in an overlapping manner unlike examples we will discuss below. It should be noted that the physical relationship between a storage location for the data block and that for the corresponding parity is completely arbitrary. This process is repeated for data block 2, data block 3, and so on in carrying out the coding.

Now, processing according to a first example of the coding scheme according to the present invention will be described below with reference to FIG. 1B. First, data block 1 illustrated in FIG. 1A is BCH-coded to obtain its parity, and the parity bits are stored as parity 1 away from data block 1 on its right-hand side. Subsequently, with respect to data block 2, an $N_2$-byte data block which is obtained by combining a part of data block 1 (a portion of data block 1 shaded in FIG. 1B) with data block 2 is subjected to BCH coding to obtain a second set of parity bits or parity 2. This coding provides an error correcting performance capable of correcting t bits of errors in relation to $N_2$ bytes. The similar coding is executed to a data block obtained by combining data in the right end portion (the shaded portion) of data block 2 with data block 3 to obtain a third set of parity bits or parity 3. For data block 4, data in the right end part (the shaded portion) of the data block 3 are combined with data block 4, and the coding is executed thereto to obtain a fourth set of parity bits or parity 4. In other words, because each shaded portion is coded twice, it may also be referred to as an "overlap portion" or "overlapping portion". The storage locations for the parities illustrated in the drawing are mere examples. As discussed above, parity storage locations can be arbitrarily set. In the above, for the ease of discussion, the coding is described as being serially executed starting from the left-most data block to the right-most data block. However, in an actual operation, all data blocks can be simultaneously coded, in which case the effective speed necessarily becomes higher.

Figure 1B:
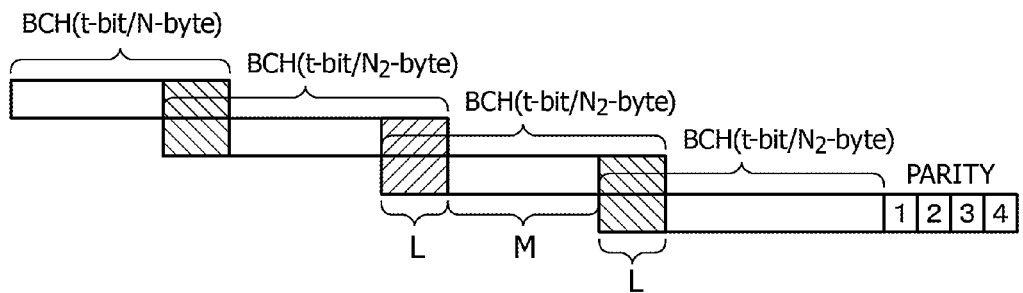

In other words, in FIG. 1B, the left-most data block 1 of the four data blocks constituting one page is subjected to coding as it is without any manipulation. For the other three data blocks, coding is executed so that the length of the BCH codes slightly increases. The coding is executed so that, for the data in the increased portion, the right-end portion of the code becomes the same as the left-end portion (shaded portion) of the next code on the right-hand side. To put it another way, the data yet to be coded and data that existed before coding in the right end portion of the coded data block are used to generate a code for the next data block, i.e., a code placed on the right-hand side. As a result, the coding is executed so that the four BCH codes to be processed have mutually "overlapping" portions. The term "overlap" herein means that parts of mutually adjacent data blocks are used again in coding the next data block. The "overlap" can be performed in various ways. In this embodiment, an end of a data block to be BCH-coded is the same as the right end of the data block adjacent to the left, while the left-most BCH code is generated by coding the left-most data block 1 as it is. The length of the BCH codes for the data blocks 2 to 4 is $N_2$. The length $N_2$ is an integer greater than the above-described length N. The size of the BCH-coded data block on the left end is N (the same as the original size). On the other hand, the BCH-coded data blocks 2 to 4 have the size $N_2$, which is larger than N. Accordingly, the code is herein referred to as "BCH (t-bit/$N_2$-byte)". The length $N_2$ is expressed as:

$$N_2 = 2L + M$$

where L is the byte count of the overlap portion and M is the byte count of a non-overlap portion. In order to differentiate from the embodiments of the present invention, examples of non-overlap coding are herein referred to as "ordinary BCH coding".

According to the coding scheme illustrated in FIG. 1B, a data block having the same correcting performance as that in the ordinary BCH coding necessarily exists. In the example illustrated in FIG. 1B, it is the left-most data block 1. Because this data block is coded according to the same coding scheme as the ordinary BCH coding, this data block is always correctable if it can be corrected by the ordinary BCH coding. For the other data blocks, the probability of successfully correcting errors is higher if one or two of the two overlapping BCH codes can correct any errors in the codes, because the capability of correcting t bits the BCH code has can be used to take care of correcting possible errors in M bytes, which is shorter than N bytes. Accordingly, the coding illustrated in FIG. 1B always has a correcting performance higher than that of the ordinary BCH coding.

Figure 1C:
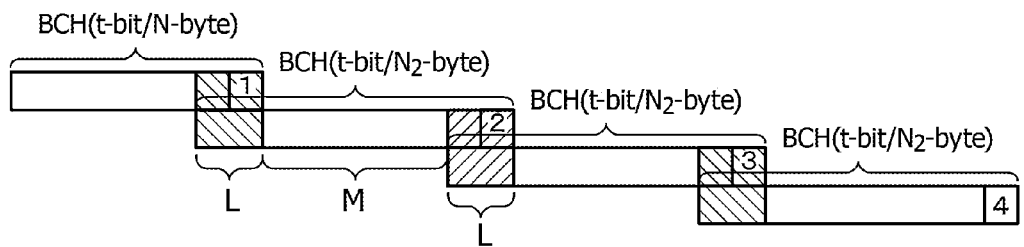

FIG. 1C illustrates a second coding example of the present invention. In this embodiment, parity bits are placed on the right-hand side of the coded data block, and they are included in an overlap portion used in coding the next data block. More specifically, data block 1 is coded first to obtain parity 1. Subsequently, parity 1 is placed on the right-hand side of data block 1, and data block 2 is coded with the right end portion of data block 1 and parity 1 as an overlapped portion. Parity 2 thus obtained is then placed on the right-hand side of the data block that has the above-mentioned overlapping portion. The above-described processes are sequentially repeated for the coding of the entire page, which ends when parity 4 is placed on the right-hand side of the data constituted by the last data block 4 and the overlapping portion. In this example, the data blocks are serially coded starting from data block 1. The coding cannot be executed simultaneously on all data blocks.

In the coding structure illustrated in FIGS. 1A and 1B, the data blocks to be coded are arranged in a stepped manner for the purpose of discussing the coding schemes. However, this does not mean that the upper data are copied to the lower data, but it means that a part of the upper data is included in the coding a part of the lower data. The actual storage of data is not different from the example illustrated in FIG. 1A. The same is applicable to the examples illustrated in FIG. 2 and subsequent drawings. Physical locations for storing parity bits are not particularly illustrated in any of FIG. 2 and subsequent drawing that illustrate coding structures. However, the examples illustrated in such drawings should be interpreted as including both the examples illustrated in FIG. 1B and FIG. 1C.

Figure 2A:
FIGS. 2A and 2B are conceptual diagrams illustrating another example of the coding method according to the present invention.
Figure 2B:
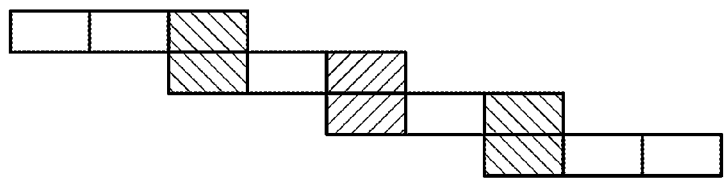

It should be particularly noted that it is not always necessary to increase the size of the data blocks located second from the left and beyond as illustrated in FIGS. 1B and 1C. The size of the BCH code may remain unchanged from N, if some data are read from the left data block in the overlapping manner when coding. In such case, the number of BCH codes increases in correspondence with the existence of overlapping portions. As illustrated in FIGS. 2A and 2B, when L is N/3, the number of N byte BCH codes to be read from the same page can be changed from 3 to 4. In this case, the number of circuits for decoding increases from 3 to 4. Overlapping portions are provided between adjacent BCH codes. However, it is not always necessary that the overlapping portions are provided between adjacent codes. That is, the overlapping portions can be provided in various ways including in such a manner as providing an overlapping portions for alternating pairs of codes. In FIG. 2A and subsequent drawings, locations of parities are not shown. This is because physical locations for storing parities are not very important in terms of the context of the present invention as described above.

Figure 3:
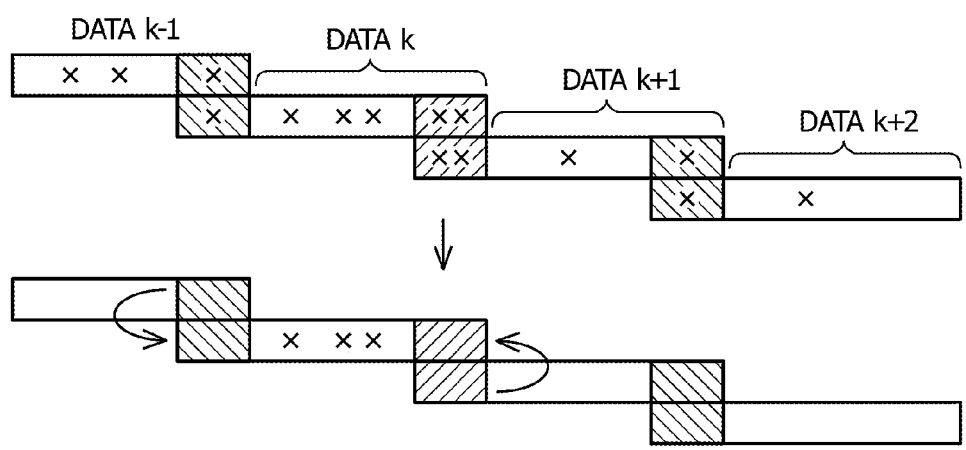
FIG. 3 is a conceptual diagram for describing the operating principle of the present invention.

In order to discuss the principle of the present invention, a simple example illustrated in FIG. 3 will be considered. In FIG. 3, the four data blocks (k−1), k, (k+1), and (k+2) illustrated in FIG. 1A are read in the mutually overlapping manner when they are coded. In FIG. 3, each data block corresponds to one BCH code as discussed above. Each cross represents the location where an error bit exists. With respect to data block (k−1), three error bits exist. When data block (k−1) is coded as it is, code (k−1) is generated. Assuming that the correctable error bit count t is equal to 4, the three error bits, whose number is less than 4, can be successfully corrected. On the other hand, because code k, which is obtained by coding the overlapping portion (the shaded portion in the drawing) between data block k and data block (k−1) adjacent thereto, includes six error bits, the errors cannot be corrected (as five or more error bits cannot be corrected) by the BCH coding scheme used in this example. Ordinarily, the error correction for that section has to be given up. However, if we look at code (k+1), which is obtained by coding data block (k+1) and the overlapping portion between data block (k+1) and data block k located adjacent thereto, only four error bits exist. Accordingly, code (k+1) can be corrected. Because codes (k−1) and (k+1) can be decoded correctly, three error bits which exist in the overlapping portions of code k with data blocks (k−1) and (k+1) can be corrected by substituting the data for the overlapping portions (the shaded portions in the drawing) with corrected data. Then, only three error bits remain in code k. Accordingly, the error bits included in code k can be corrected together with the error correction of the codes on both sides. However, if five error bits exist in a non-overlapping portion, the scheme of the present example would be incapable of correcting these errors.

We have taken an example where the two codes adjacent to one uncorrectable code are correctable, even if two codes adjacent to each other are uncorrectable, if two other codes externally adjacent to the two neighboring codes (two codes that sandwiches the two neighboring codes) are correctable, then the two neighboring codes in the middle may possibly be corrected.

It can be seen that at least one of the following characteristics can be achieved from the basic principle of the present invention. That is, (1) in view of the basic principle, the error correcting performance of the present invention is never lower than that of ordinary error correction coding methods. In other words, if existing errors can be corrected by ordinary error correction coding methods, the errors can be always corrected by a method or a coding structure which utilizes the principle of overlapping coding according to the present invention. On the other hand, if existing errors cannot be corrected by ordinary error correction, the errors may possibly be corrected by a method or a coding structure according to the present invention. (2) Next, if the error state is the same (if the error rates are the same), with respect to the same number of redundant bits, the error correcting performance of the coding and decoding methods that use the principle of overlapping data coding according to the present invention always results in an improvement over that of ordinary error correction techniques. (3) Furthermore, if the overlapping data coding according to the present invention is used to the same Galois field (e.g., a $2^{14}$ Galois field), the physical size of the required correction circuitry does not greatly differ from that according to ordinary error correction methods.

Figure 4:
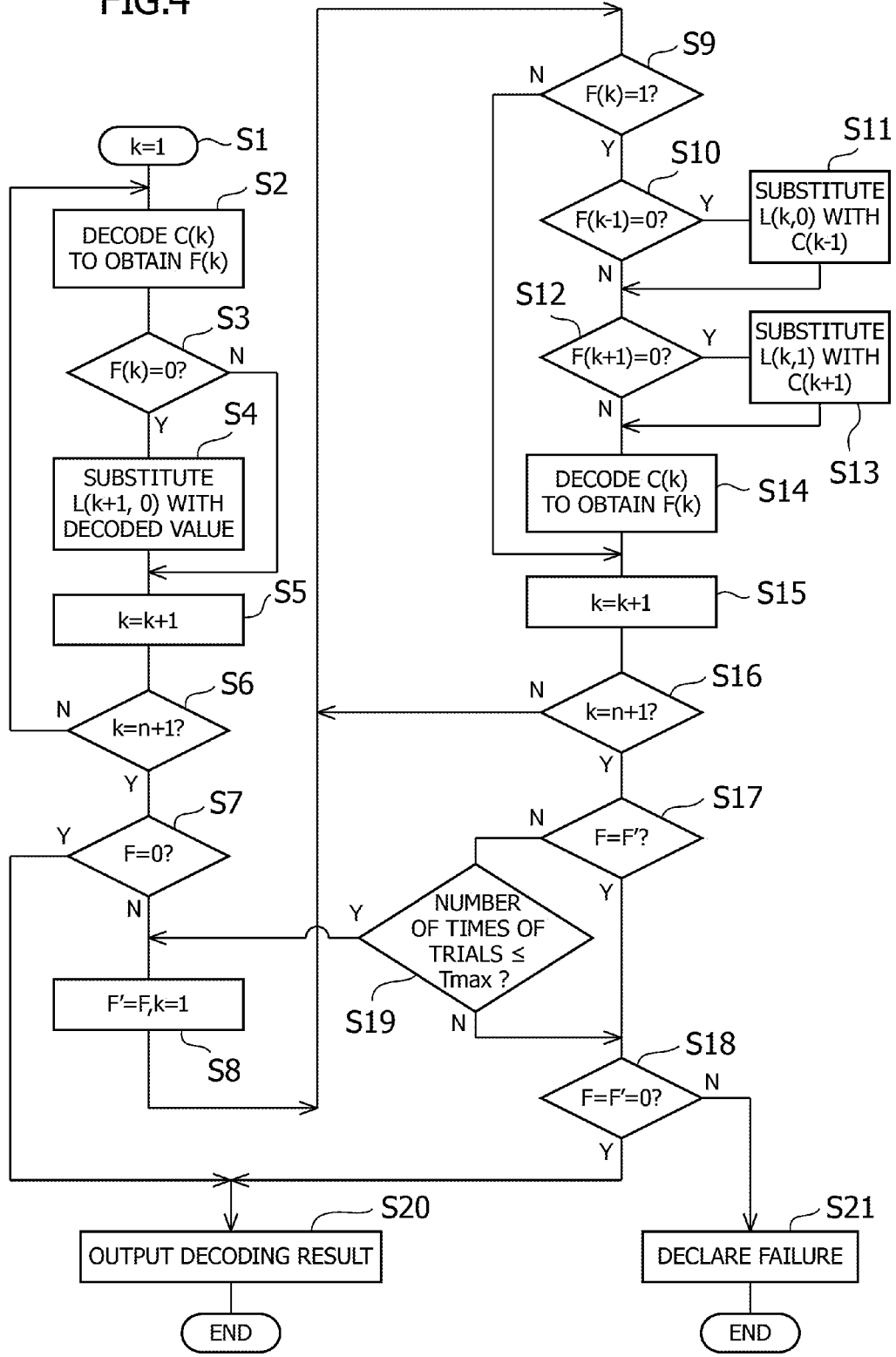
FIG. 4 is a flow chart of an example of a decoding method according to the present invention.

FIG. 4 illustrates an example of an information processing flow for decoding according to an embodiment of the present invention. First, suppose that n pieces of BCH codes exist in each page, and call them codes C(1), C(2), C(3), ... C(n). These codes are generated by dividing the page data and separating it into each code by referring to the rule that was used when data were coded. L(k,0) and L(k,1) respectively denote overlapping regions of BCH codes C(k−1) and C(k+1) with code C(k). A numerical value sequence F={F(1), F(2), ... F(n)}, which is a numerical value sequence of flags which represent whether codes can be corrected, is defined. More specifically, F denotes a vector value while each of F(1), F(2), and the like denotes a scalar quantity. If errors in C(k) can be corrected when decoded, F(k)=0. On the other hand, if errors in C(k) cannot be corrected, F(k)=1. The flow illustrated in FIG. 4 is executed accordingly.

First, k is set to an initial value (k=1) (Step S1). Then, C(k) is decoded to obtain a flag value F(k) which represents whether or not errors were fully corrected (Step S2). If errors included in C(k) have been corrected, F(k) is set to 0. Accordingly, the processing advances to Step S4. On the other hand, if F(k)=1, then the processing advances to Step S5 (Step S3). If F(k)=0, L(k+1,0) is substituted with the corresponding portion of the decoded bits (Step S4). This is repeated for k=1 to k=n (Steps S5 and S6). When the processing for k=n is completed, whether or not all the numerical values in the numerical value sequence F are 0 is determined. If all the numerical values are determined to be 0, the result of decoding is output, and then the processing ends (Step S20). If any numerical value in the numerical value sequence F is 1, then k is reset to 1 and F is stored as F' (Step S8), and then an attempt is made to correct the uncorrected codes by utilizing a decoding value for an adjacent code.

First, by checking if F(k)=1, a code whose errors were not fully corrected is identified (Step S9). It is checked if F(k)=1 or if errors in the code are not fully corrected, then whether F(k−1)=0 is determined (e.g., whether errors in C(k−1) have been corrected (Step S10). If errors in C(k−1) have been corrected, L(k,0), which is one of the overlapping portions of C(k), is substituted by using the result of decoding C(k−1) (Step S11). If errors in C(k−1) have not been fully corrected, the processing directly advances to the next step. Next, whether F(k+1)=0 (e.g., whether errors in C(k+1) have been corrected) is determined (Step S12). If errors in C(k+1) have been corrected, then L(k,1), which is the other of the overlap portions of C(k), is substituted by using the result of decoding C(k+1) (Step S13). If errors in C(k+1) have not been corrected, the processing directly advances to the next step. Then, C(k) is newly decoded and the result of verification as to whether the correction has been properly executed is set as a new value for F(k) (Step S14). This is repeatedly executed from k=1 to k=n (Steps S15 and S16).

If F(k) is not equal to 1 in Step S9, the processing directly advances to Step S15.

If the new F and the previously stored F' are not the same, that is, if any of the previously uncorrected errors have been corrected (step S17), and if the number of trials does not exceed a previously set maximum value $T_{max}$ (step S19), then the processing returns to step S8. In step S8, an attempt is made to decode the uncorrectable adjacent code by using the code that has newly become correctable. If F=F', that means that any improvement is no longer achieved even if the processing is repeated further. Accordingly, if F=0 (Step S18), the value of C(k), which is the result of the processing so far, is output (Step S20). If the numerical value sequence of F includes at least one value 1 (Step S18), it is declared that the error correction was not properly done, and then the processing ends (Step S21). Normally, the repetition of the processing is done once or twice even if such repetition is necessary.

Figure 5A:
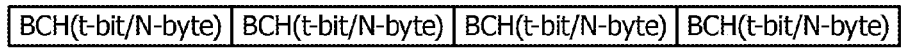
FIGS. 5A to 5C are conceptual diagrams illustrating a third example and a fourth example, respectively, of the coding method according to of the present invention.
Figure 5B:
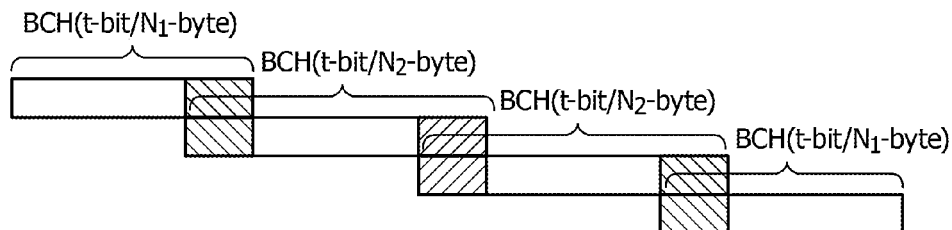

FIG. 5 illustrates third and fourth examples of the BCH coding according to the present invention. FIG. 5A illustrates ordinary BCH coding for reference. Suppose that the data length is N-byte and the correctable bit counts is t, we designate the code as "BCH (t-bit/N-byte)" similar to the examples described above. Parities are not shown. FIG. 5B illustrates the third example, in which the overlapping portions are generated in a symmetrical manner in the left/right direction. In this example, ECC 1 corresponding to data block 1 includes the overlapping portion on its right side. Accordingly, ECC 1 is BCH (t-bit/$N_1$-byte). ECC 2, which corresponds to the next data block 2, includes overlapping portions on its right and left sides. Accordingly, ECC 2 is BCH (t-bit/$N_2$-byte). ECC 3 is similar to the ECC 2. ECC 4 is the same as ECC 1 except that ECC 4 includes an overlapping portion on its left side. In this example, $N<N_1<N_2$, and the length of the non-overlapping portions is the same for ECCs 1 to 4.

Figure 5C:
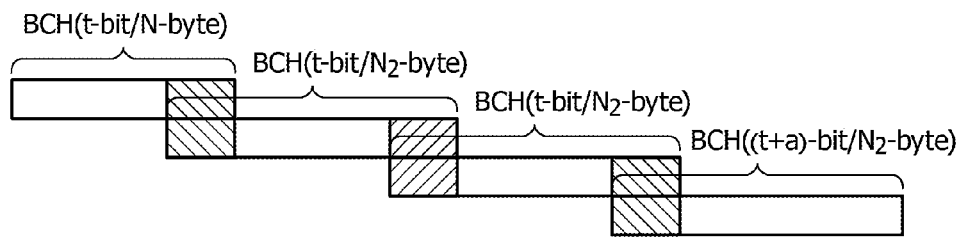

FIG. 5C illustrates the fourth example of the coding according to the present invention. Although the example illustrated in FIG. 5C is similar to the one in FIG. 5B, this example employs BCH ((t+a)-bit/$N_2$-byte) having a higher correcting performance only for ECC 4. In FIG. 5C, the four ECC blocks are asymmetrically arranged. More specifically, the length of ECC 1 is N, which is the same length as that of ordinary BCH codes, and the lengths of ECCs 2 and 3 are longer than N because they respectively include overlapping portions on their left and right sides. ECC 2 and ECC 3 can be represented as "BCH (t-bit/$N_2$-byte)". In this example, $N<N_2$. The length of ECC 4 is $N_2$, which is the same as that of ECCs 2 and 3, but includes only one overlapping portion. Accordingly, the error correcting performance is relatively low for ECC 4. To paraphrase this, the data length of the non-overlapping portion is larger only for ECC 4. It has been found that using this coding structure, the error correction performance is higher compared to ordinary BCH coding because errors that can be corrected by ordinary BCH coding can be always corrected. In this example, the error correction performance for a bytes is further added to reinforce the correction performance for ECC 4. The value of "a" is an arbitrary integer. When t=4, the additional correcting performance of about 2 or 3 bytes, for example, is sufficiently effective. With the above-described configuration, the total correcting performance can be further improved. Even if the correction performance for ECC 4 is improved, only minor effects are found on the scale of the entire error correction circuitry and the size of parities.

Figure 6A:
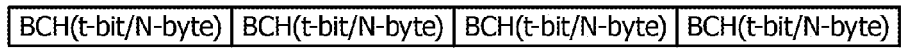
FIGS. 6A and 6B are conceptual diagrams illustrating another example of coding.
Figure 6B:
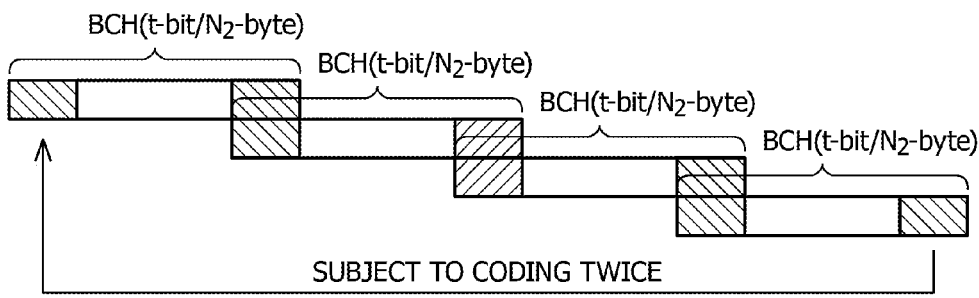

FIG. 6B illustrates coding with a ring construction that utilizes a symmetric coding structure in the right/left direction, shown in comparison with the ordinary BCH coding shown in FIG. 6A. In fact, it has been found that this configuration is not so preferable. This example has a structure in which an overlapping portion is provided to the right end of ECC 4 in the structure illustrated in FIG. 5C, and the overlapping portion is also present at the left end of ECC 1, in which the length of ECC 1 is $N_2$, and it is the same as that of the other ECCs. With the structure like this, considering the total probability of correcting errors, the performance is higher than that of the ordinary coding illustrated in FIG. 7A. However, it has been found that in some cases, errors that can be corrected by ordinary coding cannot be corrected by the coding scheme illustrated in FIG. 6B. This will be explained with reference to FIG. 7.

Figure 7A:
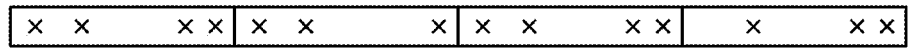
FIGS. 7A and 7B are conceptual diagrams for illustrating problems occurring in association with the coding illustrated in FIG. 6.
Figure 7B:
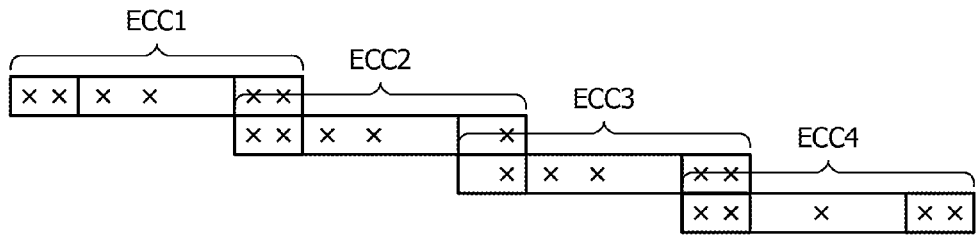

Suppose that error bits indicated by crosses are included in the case of the ordinary coding illustrated in FIG. 7A. In this example, the error bit count is four or three for each data block. Accordingly, it is supposed that all the errors can be corrected by using BCH codes with the correction performance of 4-bit errors. However, if the coding structure described above with respect to FIG. 6B is employed, the errors cannot be corrected for any ECC with the 4-bit correction performance because five or more errors are included in each ECC as illustrated in FIG. 7B. Because controllers are presently designed based on the bit count of the correction performance, it is not preferable that errors that can be corrected by ordinary coding cannot be corrected by new coding structures or schemes.

Figure 8A:
FIGS. 8A and 8B are conceptual diagrams illustrating that the errors distributed in the exemplary manner illustrated in FIG. 7A can be corrected by the exemplary coding method illustrated in FIG. 1B.
Figure 8B:
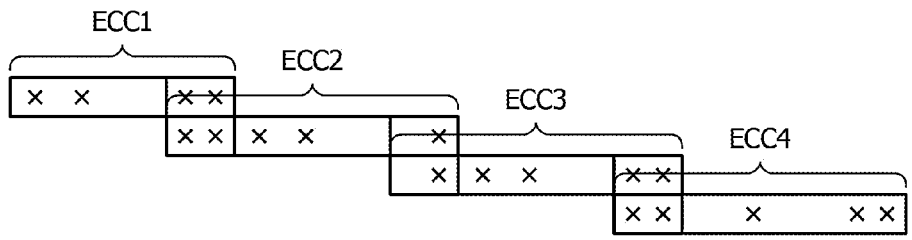

As illustrated in FIG. 8B, when the coding scheme shown in FIG. 1A is employed, in the example in which errors are distributed as illustrated in FIG. 7A, all the errors can be corrected with the 4-bit correction performance without performing particularly reinforced error correction on ECC 4. In other words, it has been found that errors that can be corrected by ordinary coding can be always corrected by the coding structure according to the present invention. This also applies to the case where the coding structure illustrated in FIG. 5B is employed. In addition, as described above with reference to FIG. 5C, an error correction circuit with a higher correction performance, such as a circuit with a 6-bit correction performance, can be employed only for ECC 4. With this configuration, the entire performance can be further improved without requiring a greatly-increased physical size of the entire error correction circuit.

Figure 9:
FIG. 9 is a conceptual diagram illustrating an example of how an overlap according to the present invention is performed.
Figure 10:
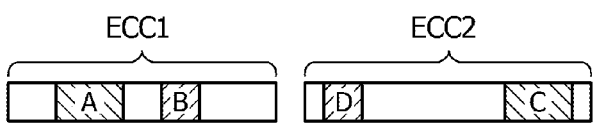
FIG. 10 is a conceptual diagram illustrating an example of how an overlap according to the present invention is performed.
Figure 11:
FIG. 11 is a conceptual diagram illustrating an example of how an overlap according to the present invention is performed.
Figure 12:
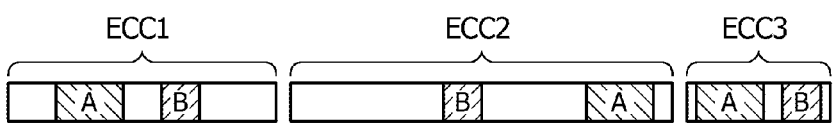
FIG. 12 is a conceptual diagram illustrating an example of how an overlap according to the present invention is performed.
Figure 13:
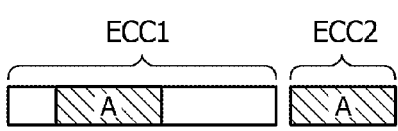
FIG. 13 is a conceptual diagram illustrating an example of how an overlap according to the present invention is performed.

FIGS. 9 through 13 illustrate other examples of overlapping portions of data in the coding method according to the present invention. In FIGS. 9 through 13, parity bits or parities are not shown. In FIG. 9, data of section A in the data portion of a first error correcting code, ECC 1, is overlapped with section B in the adjacent second error correcting code to obtain a second error correcting code, ECC 2. The bit sizes of the corresponding overlapping portions are the same, but the location of the overlapping portion in each error correcting code is different. FIG. 10 illustrates an example in which two overlapping portions are provided between the first error correcting code, ECC 1, and the second error correcting code, ECC 2. Sections A and B of ECC 1 are respectively overlapped with sections D and C of ECC 2. FIG. 11 illustrates an example in which the same data sections A and B are commonly included in four error correcting codes, ECCs 1 to 4. The length of ECC 4 is shorter than that of other error correcting codes. FIG. 12 illustrates a case in which the error correcting codes have different sizes. The same data sections A and B are commonly included in three error correcting codes, ECCs 1 to 3. With respect to the example in FIG. 13, an exemplary configuration can also be employed in which the second error correcting code, ECC 2, is shorter than the first error correcting code, ECC 1, and all the data of ECC 2 are commonly included as a part of the first error correcting code. By changing locations and sizes of overlapping portions as described above, the decoding success rate may increase using portions of each section in which errors frequently occur as overlapping portions.

Figure 14:
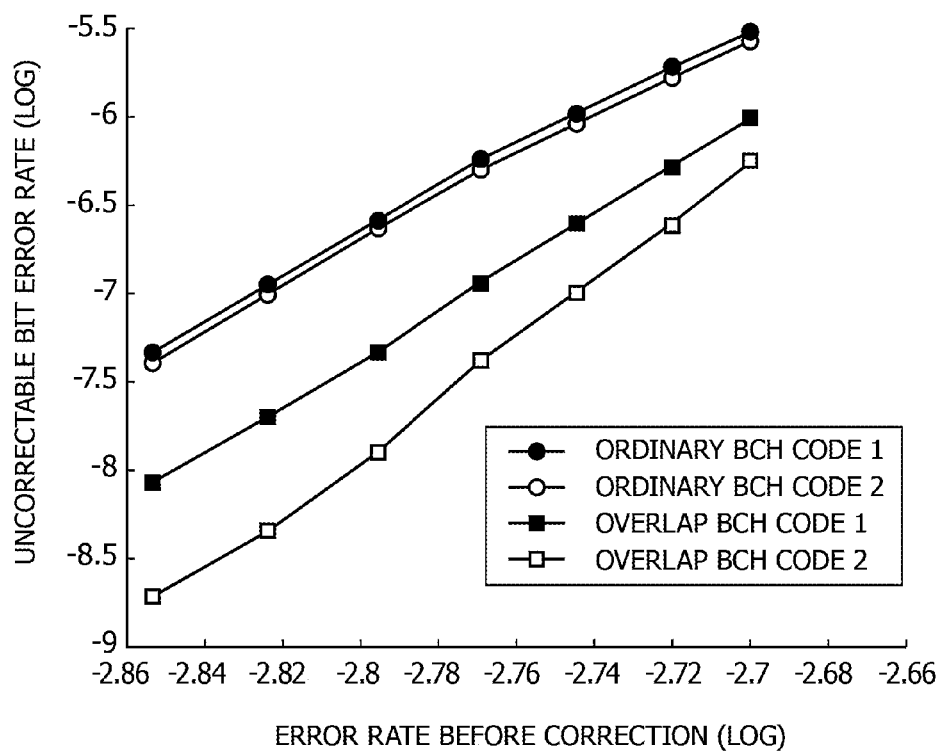
FIG. 14 is a graph illustrating results of simulation for showing effects of another embodiment of the present invention.

FIG. 14 is a graph showing results of simulation for comparing the effects of the coding examples illustrated in FIGS. 1B and 5C with those of ordinary BCH coding. As conditions for the simulation, the page size was 8 kB, which was divided into eight sections. Accordingly, the size of each section was 1 kB. A model in which errors randomly occur in a binary symmetric channel (BSC) was employed. The code rate was set at 0.9609. For the ordinary BCH coding schemes for comparison, BCH (24 bits/1,024 bytes) was used. As the overlap model according to the present invention, BCH (24 bits/1,336 bytes) was employed. More specifically, basically, BCH (24 bits/1,024 bytes) was used for the left-most region among of the above-described eight regions, and for the remaining regions, original data are coded by using 312 byte data existing on the right end of each neighboring region on the left-hand side. Thus, BCH (24 bits/1,336 bytes) was used for all these regions except the left-most region. The results are indicated by "Ordinary BCH 1" and "Overlap BCH 1." On the other hand, with respect to "Ordinary BCH Code 2" and "Overlap BCH Code 2" as illustrated in FIG. 5C, BCH (27 bits/1,336 bytes) was employed for the right-most EEC with the correction performance being improved by 3 bits. In ordinary BCH coding, the performance did not greatly improve as a matter of course by applying an error correction circuit with a higher error correction performance only for an ECC including a smaller overlapping portion, but the performance greatly improved by applying such higher-performance circuit in the overlap coding method according to the present invention. It was observed that the error rate of the coding illustrated in FIG. 1B was about ⅕ of that of ordinary coding. The error rate before the error correction of the present invention and the uncorrected bit error rate were plotted on the x-axis and the y-axis, respectively, in the logarithmic scale. The term "uncorrectable bit error rate" is herein defined as a rate obtained by dividing the "uncorrectable page counts" by the "total number of pages" and the "size of the page represented in the unit of bits".

Figure 15:
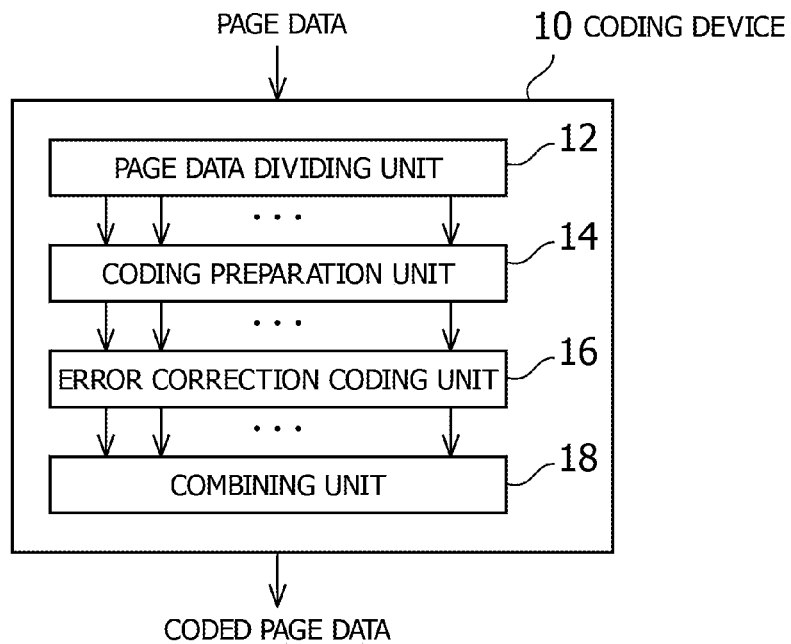
FIG. 15 is a block a diagram of an example of a coding device according to the present invention.

FIG. 15 is a block diagram showing an example of a coding device according to the present invention. A coding device 10 receives page data yet to be coded and outputs coded page data. The coding device 10 includes a page data dividing unit 12, a coding preparation unit 14, an error correction coding unit 16, and a combining unit 18. The page data dividing unit 12 divides data constituting one page and yet to be coded into a plurality of data blocks including a first data block, which is located on one end of one page, to an M-th data block, which is located on the other end of the page (M is an integer of 2 or greater). The coding preparation unit 14 adds data of a part of an adjacent data block to the original data block according to a predetermined rule and reads data to be coded. The error correction coding unit 16 executes coding on the read data, and error correcting codes corresponding to respective data blocks are generated as a result. The error correcting codes are combined by the combining unit 18 to form coded page data, and the data are output. In this processing, the coding is usually executed simultaneously on all data blocks, but the coding can be also executed serially on respective data blocks. In FIG. 15, the exemplary case where the coding is simultaneously executed on all the data blocks is shown, but the present invention is by no means limited to this example.

The coding page data generated by the coding device 10 is to be stored on a storage medium or transmitted for communication.

Figure 16:
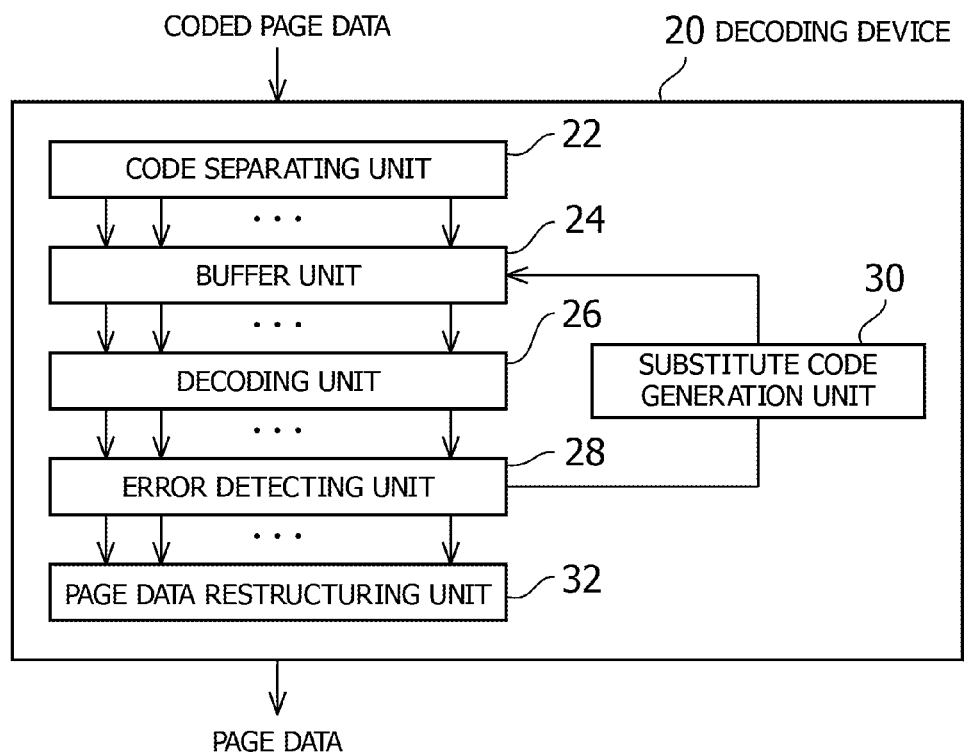
FIG. 16 is a block a diagram of an example of a decoding device according to the present invention.

FIG. 16 is a block a diagram of an example of a decoding device according to the present invention. A decoding device 20 is a device for decoding coding page data generated by the coding device illustrated in FIG. 15. First, a code separation unit 22 separates the coded page data into respective error correcting codes according to the rule used in the coding. The separated error correcting codes are stored in a buffer unit 24. The buffer unit 24 can be omitted under appropriate conditions. Next, a k-th error correcting code loaded from the buffer unit 24 is decoded by a decoding unit 26. An error detecting unit 28 verifies whether any error is included in the decoded data.

If any error exists in the data obtained by decoding the k-th error correcting code, the error detecting unit 28 determines whether errors in a (k+1)-th error correcting code including a portion that has been coded in combination with th k-th error correcting code or a (k−1)-th error correcting code or both can successfully be corrected. A substituted code generation unit 30 substitutes the portion of the k-th error correcting code coded in combination by utilizing the corrected error correcting code to generate a substituted k-th error correcting code. The generated substituted k-th error correcting code is transmitted to the decoding unit 26 directly or via the buffer unit 24. The decoding unit 26 decodes the substitution k-th error correcting code again.

If no error is included in the data obtained by decoding the k-th error correcting code, the data is transmitted to a page data restructuring unit 32 to reproduce the page data to be output.

What is claimed is:

1. A coding method comprising the steps of:
   dividing data constituting one page and yet to be coded into data blocks including a first data block located on one end of the one page to an M-th data block located on the other end of the one page, wherein M is an integer of 3 or greater;
   generating a first error correcting code by coding the first data block;
   generating a second error correcting code by coding a second data block and a part of the first error correcting code or the first data block in combination;
   executing processing executed on the second data block onto a third data block and up to an (M−1)-th data block by shifting the error correcting code or the data block to be combined by one code or one block; and
   generating an M-th error correcting code by coding an M-th data block and a part of the (M−1)-th error correcting code or the (M−1)-th data block in combination,
   wherein the step of generating the first error correcting code to the step of generating the M-th error correcting code are serially or simultaneously executed.

2. An error correction coding method comprising the steps of:
   dividing data constituting one page and yet to be coded into data blocks including a first data block located on one end of the one page to an M-th data block located on the other end of the one page, wherein M is an integer of 3 or greater;
   generating a first error correcting code by coding the first data block and a part of a second data block in combination;
   generating a second error correcting code by combining and coding a second data block, a part of the first error correcting code or the first data block, and a part of a third data block in combination;
   executing processing executed on the second data block onto the third data block and beyond up to an (M−1)-th data block by shifting the error correcting code or the data block to be combined by one code or one block; and
   generating an M-th error correcting code by coding an M-th data block, and a part of the (M−1)-th error correcting code or the (M−1)-th data block in combination,
   wherein the step for generating the first error correcting code to the step of generating the M-th error correcting code are serially or simultaneously executed.

3. The error correction coding method according to claim 1, further comprising applying, to a data block with which a portion to be coded in combination is relatively small for a size of data to be coded, an ECC with higher error correcting strength than that applied to a data block other than the data block with which the portion to be coded in combination is relatively smaller for the size of data to be coded.

4. The error correction coding method according to claim 2, further comprising applying, to a data block with which a portion to be coded in combination is relatively small for a size of data to be coded, an ECC with higher error correcting strength than that applied to a data block other than the data block with which the portion to be coded in combination is relatively smaller for the size of data to be coded.

5. An error correction decoding method comprising the steps of:
   determining whether an error is successfully corrected by decoding a k-th error correcting code coded by the error correction coding method according to claim 1;
   if the correction is not successful, determining whether a (k+1)-th error correcting code including a portion that has been coded in combination with the k-th error correcting code or a (k−1)-th error correcting code or both can successfully correct an error, and substituting a corresponding portion of the k-th error correcting code by utilizing a successfully corrected error correcting code; and
   decoding the substituted k-th error correcting code.

6. An error correction decoding method comprising the steps of:
   determining whether an error is successfully corrected by decoding a k-th error correcting code coded by the error correction coding method according to claim 2;
   if the correction is not successful, determining whether a (k+1)-th error correcting code including a portion that has been coded in combination with the k-th error correcting code or a (k−1)-th error correcting code or both can successfully correct an error, and substituting a corresponding portion of the k-th error correcting code by utilizing a successfully corrected error correcting code; and
   decoding the substituted k-th error correcting code.

7. A coding method comprising:
   dividing data constituting one page and yet to be coded into M data blocks including a first data block and a second data block;
   generating a first error correcting code by coding the first data block;
   generating a second error correcting code by combining and coding the second data block and a part of the first error correcting code or the first data block in combination;
   executing processing executed on the second data block onto a third data block and up to an (M−1)-th data block by shifting the error correcting code or the data block to be combined by one code or one block; and
   generating an M-th error correcting code by coding an M-th data block and a part of the (M−1)-th error correcting code or the (M−1)-th data block in combination.

8. A coding method comprising the steps of:
dividing data constituting one page and yet to be coded into M data blocks including a first data block and a second data block;
generating a first error correcting code by coding the first data block and a part of the second data block in combination;
generating a second error correcting code by combining and coding the second data block and a part of the first error correcting code or the first data block;
executing processing executed on the second data block onto a third data block and up to an (M−1)-th data block by shifting the error correcting code or the data block to be combined by one code or one block; and
generating an M-th error correcting code by coding an M-th data block and a part of the (M−1)-th error correcting code or the (M−1)-th data block in combination.

9. An error correction decoding method comprising the steps of:
determining whether correction of an error has been successfully executed by decoding a first error correcting code coded by the error correction coding method according to claim 8;
if the correction is not successful, determining whether a second error correcting code can successfully correct an error, and if correction of the second error correcting code is successful, substituting a part of the first error correcting code by utilizing a successfully corrected second error correcting code; and
if correction of the first error correcting code is successful, decoding the second error correcting code by substituting the portion of the second error correcting code coded in combination with the first error correcting code.

10. A coding device comprising:
a page data dividing unit configured to divide data constituting one page and yet to be coded into data blocks including a first data block located on one end of the one page to an M-th data block located on the other end of the one page;
a coding preparation unit configured to generate data to be coded by adding a part of an adjacent data block or an adjacent error correcting code to a subject data block according to a predetermined rule;
an error correction coding unit configured to generate error correcting codes corresponding to respective data blocks by executing coding on the generated data;
a substituting code generation unit configured, if any error is included in decoded data corresponding to a subject error correcting code, to determine whether one or two error correcting codes that have a portion coded in combination with a subject error correcting code are decoded and corrected without an error by using the error detection unit and substitute a portion of the subject error correcting code by utilizing the error correcting code that has been corrected without an error, so as to generate a substituted error correcting code and return the same to the buffer; and
a combining unit configured to generate coded page data by combining the generated error correcting codes.

11. A decoding device comprising:
a code separating unit configured to separate coding page data into respective error correcting codes constituting the coding page data according to a rule used in coding;
a decoding unit configured to decode the separated error correcting codes to obtain decoded data;
an error detection unit configured to verify whether any error is included in the decoded data;
a substituting code generation unit configured, if any error is included in decoded data corresponding to a subject error correcting code, to determine whether one or two error correcting codes that have a portion coded in combination with a subject error correcting code are decoded and corrected without an error by using the error detection unit and substitute a portion of the subject error correcting code by utilizing the error correcting code that has been corrected without an error, so as to generate a substituted error correcting code and return the same to the buffer; and
a page data restructuring unit configured to output page data corrected without an error.

* * * * *